United States Patent
McDonough et al.

(10) Patent No.: US 9,914,852 B2
(45) Date of Patent: Mar. 13, 2018

(54) REDUCTION IN LARGE PARTICLE COUNTS IN POLISHING SLURRIES

(71) Applicant: Fujifilm Planar Solutions, LLC, North Kingstown, RI (US)

(72) Inventors: James McDonough, Gilbert, AZ (US); Laura John, Chandler, AZ (US); Deepak Mahulikar, Kingstown, RI (US)

(73) Assignee: FUJIFILM PLANAR SOLUTIONS, LLC, North Kingstown, RI (US)

( * ) Notice: Subject to any disclaimer, the term of this patent is extended or adjusted under 35 U.S.C. 154(b) by 0 days.

(21) Appl. No.: 14/462,695

(22) Filed: Aug. 19, 2014

(65) Prior Publication Data
US 2016/0053136 A1    Feb. 25, 2016

(51) Int. Cl.
| H01L 21/302 | (2006.01) |
| H01L 21/461 | (2006.01) |
| C09G 1/02 | (2006.01) |
| H01L 21/321 | (2006.01) |

(52) U.S. Cl.
CPC ............ *C09G 1/02* (2013.01); *H01L 21/3212* (2013.01)

(58) Field of Classification Search
USPC ........................................................ 438/692
See application file for complete search history.

(56) References Cited

U.S. PATENT DOCUMENTS

| 2003/0051413 A1* | 3/2003 | Sakai ...................... C09G 1/02 51/307 |
| 2009/0056231 A1 | 3/2009 | White et al. |

FOREIGN PATENT DOCUMENTS

| CN | 1398939 A | 2/2003 |
| CN | 1646649 A | 7/2005 |
| TW | 200714699 | 4/2007 |

OTHER PUBLICATIONS

Taiwan Office Action dated May 24, 2016 for Taiwan patent application No. 104123427.
Chinese Office Action dated Oct. 11, 2017 for Chinese patent application No. 201510508285.4.

* cited by examiner

*Primary Examiner* — Roberts Culbert
(74) *Attorney, Agent, or Firm* — Ohladnt, Greeley, Ruggiero & Perle, LLP

(57) ABSTRACT

The present disclosure provides a method for reducing large particle counts (LPCs) in copper chemical mechanical polishing slurry by way of using high purity removal rate enhancer (RRE) in the slurry. The conductivity of the RRE in deionized water solutions correlates very strongly with the number of LPCs in the RRE, and thus in a slurry using the RRE.

6 Claims, 4 Drawing Sheets

REDUCTION IN LARGE PARTICLE COUNTS IN POLISHING SLURRIES

BACKGROUND OF THE DISCLOSURE

1. Field of the Disclosure

The present disclosure relates to reduced large particle counts in slurries used in chemical mechanical polishing. In particular, the present disclosure relates to the purity of the copper removal rate enhancer used in the slurry, typically an amino acid or derivative thereof.

2. Description of the Related Art

The process known as chemical mechanical polishing or planarization (CMP) involves the planarization of different layers on semiconductor wafers using a polishing pad and slurry to polish away excess or unwanted layers of materials prior to construction of subsequent layers. Due to its extraordinary conductivity, copper is a commonly used material for forming interconnects in semiconductor manufacturing. Once a copper inlaid structure is formed by, for example, a damascene process which deposits copper according to the pattern dictated by a stenciled template on the substrate, isolated copper wires are made by polishing and clearing copper and diffusion barrier metal between the inlaid wires. Copper and barrier layer CMP involves the repeated cycle of copper and barrier layer polishing for each layer as the back end of line layers of the chip are fabricated. It is desired to polish the wafers at a high removal rate of material to enhance throughput, while still maintaining favorable wafer characteristics such as a low number of overall defects, especially scratches which are thought to be caused in part by undesirable foreign particles in the slurry. The presence of these undesirable particles is typically monitored by light scattering techniques to determine large particle counts (LPCs), in which the concentrations of particles with diameters above a selected threshold, for example 0.5 micrometers ($\mu m$) or 1.0 $\mu m$, are quantified in solution. The selected size threshold is typically well above the $99^{th}$ percentile for the size distribution of desired particles in solution and thus prohibits confusion as to whether or not particles contributing to LPCs in slurries are undesirable or desirable.

A typical copper CMP process utilizing copper slurry consists of 2 process steps which have been described in detail in the prior art such as in U.S. Pat. No. 6,083,840 (Mravic, Pasqualoni, Mahulikar). First, the electroplated copper overburden is polished down at a relatively high down force in a bulk polish step which removes the majority of the overburden. Subsequently, that remaining copper overburden from the first step is polished off at a lower down force, with a stop on the barrier layer. This step can be combined with the first step, depending on the polisher type or configuration. The goal is to clear all copper from the barrier material while avoiding a variety of defects. Namely, undesirable deep scratches from the copper CMP steps may persist during later stages of chip fabrication if they are of sufficient depth not to be removed in subsequent barrier polishing. These types of scratches can ultimately compromise device performance, and one of the potential culprits behind deep scratches would be large undesirable particles present in the copper slurry. As a result, minimizing LPCs in copper slurries continues to be a goal, particularly as device features continue to shrink at more advanced nodes and even the smallest of scratches can be detrimental to device performance and thus die yields on wafers. LPC minimization is especially important as slurries are made at higher and higher concentrations prior to being diluted by the end user by a rather large factor such as 20x, as described in U.S. Pat. No. 8,192,644 (Kim, Wen).

LPCs in CMP slurries primarily come from the abrasives used in the slurries. Typical abrasives are colloidal silica, fumed silica, ceria and alumina. In practice a process of filtration is used to remove particles larger than certain size. The prior art involves utilization of size exclusion filtration to remove physical impurities from copper slurries which contribute to LPCs. U.S. Pat. No. 6,749,488 (Mahulikar, Lafollette) describes the relationship of LPCs to defects and gives a way to control LPCs by filtration. While the contribution of abrasives to LPCs is well established, the contribution of other slurry chemicals to the LPCs is not well known. These aqueous chemicals are fully dissolved in the slurry formulation and hence may not have a significant effect on LPCs. But there could be complex factors in play. Certain chemicals can alter surface charges on the particles causing them to agglomerate, creating in situ LPCs even after filtration. Chemicals can also influence the wetting capability of filters changing the filtration efficiency. Finally they can affect the dissolution kinetics causing precipitation of species adding to LPCs. These secondary problems exist in cu slurry formulations. With the semiconductor industry demanding tighter control limits and very low variations these LPC issues must be addressed.

The use of high purity particles and high purity slurries is described in U.S. Pat. No. 8,211,193 (Mahulikar, Wang). The effect of purity on various functional performance related parameters is described, including defectivity. The functional role of the removal rate enhancer (RRE) is described in detail in the prior art such as in U.S. Pat. No. RE 37,786 (Hirabayashi, Higuchi), but the prior art fails to report purity effect of is specific chemicals in the slurry formulation on the LPCs or defects. Thus, one objective of this disclosure is to address the problems of chemical effects on the LPCs in a copper slurry in general and the effect of the purity level of RREs on the LPCs in particular. There is also a need to determine if conductivity can be a reliable indicator of how impure a slurry is, which could relate to how many defect-causing impurities are present in the slurry and if a particular slurry is likely to be prone to cause defects during copper CMP, especially deep scratches. In addition, if conductivity contributed to solution by the RRE is found to correlate with LPCs and thus how many potentially defect-causing particles are present in solution, restrictions on setting minimum purity levels of the RRE should be made.

SUMMARY OF THE DISCLOSURE

The present disclosure provides a method for reducing large particle counts (LPCs) in chemical mechanical polishing (CMP) slurries by way of using high purity removal rate enhancers (RRE) in the slurry. The present disclosure also provides slurries having reduced LPCs. The RRE can be an amino acid or derivative thereof. LPCs can cause deep scratches during CMP steps in semiconductor fabrication, and the RRE tends to introduce the largest proportion of LPCs into the copper slurry relative to other components (FIG. 1). As discussed in greater detail below, the present disclosure suggests that LPC trends observed in RRE/deionized water (DIW) solutions correspond to LPC trends seen in fully formulated copper slurries. There are also positive correlations between conductivity and LPCs contributed to solution by the RRE, and those correlations hold true over a large concentration range of dissolved RRE in DIW (FIG. 2). Quantitatively, maximum conductivity limits for the RRE in DIW solutions, which correspond to minimum purity requirements for the RRE source, can be set in order to ensure an RRE source of sufficient purity to contribute fewer LPCs to the final slurry than the prior art RRE purity restrictions. Results over a large number of slurry lots are presented in the present disclosure (FIG. 3). RRE/DIW solutions are more time efficient and less resource intensive to study, and can serve as reliable indicators of copper slurry behavior rather than having to study finished, fully formulated copper slurries which contain many other components which may interfere with instrument signals and give convoluted results.

In one embodiment, the present disclosure provides a copper chemical mechanical polishing composition, comprising a removal rate enhancer having a conductivity C in deionized water. The removal rate enhancer obeys the following inequality:

$$C<=a*W+b,$$

wherein W is the wt % of the removal rate enhancer, based on the total weight of the composition, wherein $0.0005<a<0.0025$, and wherein $0.0005<b<0.0025$. The present disclosure also provides a method of polishing a substrate using a pad and the above-recited composition.

DETAILED DESCRIPTION OF THE DISCLOSURE

Figure 1:
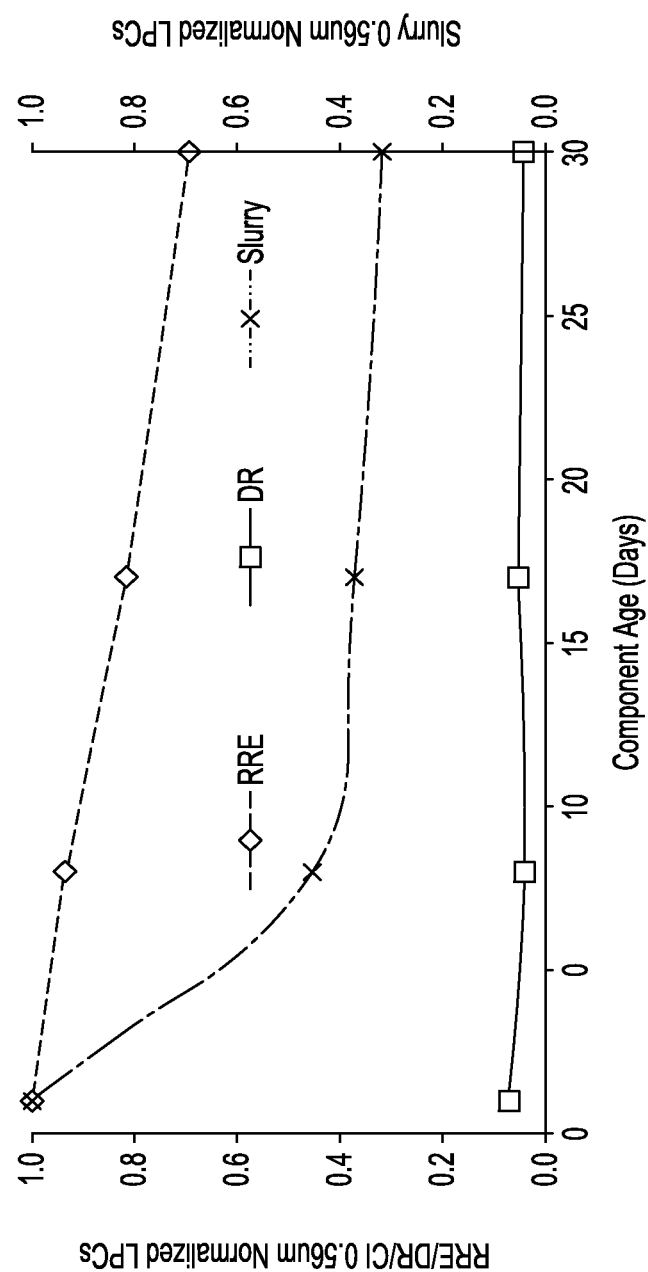
FIG. 1 is a chart which displays the relative large particle count contributions of individual copper CMP slurry components including the corrosion inhibitor, removal rate enhancer, and dishing reducer. The large particle counts contributed by the removal rate enhancer clearly trump those contributed by the dishing reducer or corrosion inhibitor.

The present disclosure provides a method for reducing LPCs in copper polishing CMP slurries, and slurries having low LPCs, by selecting removal rate enhancers (RREs) in which the RRE achieves a level of purity based on its conductivity once dissolved in deionized water (DIW) solutions (background DIW resistivity>18 megaohms). The desired conductivity for the RREs of the present disclosure can be expressed as a function of concentration which obeys the following inequality at a given concentration of removal rate enhancer (Equation 1):

$$C<=a*W+b,$$

C represents the conductivity of the RRE in DIW solution, measured in millisiemens per centimeter or another suitable conductivity unit, and W is the wt % of RRE in the solution, wherein $0.0005<a<0.0025$, and wherein $0.0005<b<0.0025$. The constant b has the same units as C, and the constant a would have units such that the product of a and W would result in the same units for b and C.

Before the present disclosure, there was nothing in the prior art or industry knowledge to suggest that controlling the conductivity of an RRE would affect the LPC of a slurry which contained that particular RRE. As discussed in greater detail below, there is a strong correlation between conductivity and LPCs that was not predictable.

The CMP slurry of the present disclosure contains an abrasive, corrosion inhibitor (CI), and the RRE, among other components. The abrasive can be selected from the group consisting of alumina, fumed silica, colloidal silica, coated particles, titania, ceria, zirconia, and any combinations thereof. The CI can be selected from the group consisting of benzotriazole and its derivatives, tolyl triazole and its derivatives, and azoles.

The RRE is selected from the group consisting of organic acids and their salts, amino acids, glycine, alanine, carboxylic acids, polyamines, ammonia based compounds, quaternary ammonium compounds, inorganic acids, compounds with both carboxylic and amino functions, ethylenediaminetetraacetic acid, diethylene triamine pentaacetic acid, and any mixtures thereof.

The RRE concentration in the slurry concentrate may levels of <100 ppm, all the way up to the solubility limits of the RRE in solution. The solubility limit of an RRE will depend on the specific RRE used. Some RREs may have a solubility limit of 1 wt %, and some may have a solubility limit of 50 wt %. For glycine, as an example, the solubility limit may be 17 wt %, 18 wt %, or up to 20 wt %. Accordingly, the RRE in the slurry and compositions of the present disclosure may be present in any amount greater than zero, up to 50 wt %, or any subranges therebetween. The RRE may also be present in any amount greater than zero, up to 20 wt %, or any subranges therebetween.

The RRE needs to be of sufficient purity to obtain the conductivity described above, whether it be in the raw material itself, or any processing that it was subjected to reach that level of purity. For example, the RRE may be of a sufficiently high conductivity as a raw material before mixing with the other components of the slurry. Alternatively, one could start with a high conductivity RRE that fails to satisfy Equation 1, mix it with one or more other components of the slurry (e.g., the corrosion inhibitor), and subject the mixture or final slurry to an ion exchange/filtration, or other purification.

Dissolution of the copper takes place at the surface of the copper layer, and the functional role of an RRE is related to that process. The removal of copper ions can be enhanced by a reaction with a RRE that can form a complex with the copper layer. This complex is typically softer or more porous than the parent copper layer prior to CMP, so the complex is less mechanically robust than metallic copper and can be more easily removed. The present disclosure references a copper layer that is polished, but the slurries and methods disclosed herein may also be used to polish other metals, such as cobalt.

As previously discussed, one of the challenges of copper CMP is that the process may introduce defects into or onto the surface of the semiconductor wafer. For instance, if the copper slurry contains large impurity particles, those particles can result in scratches on the wafer surface. Of particular concern are deep scratches which may occur during copper CMP but persist throughout subsequent fabrication steps, particularly if the barrier CMP step after copper does not remove sufficient material to smooth out the deep scratch, and ultimately lead to device failure. Scratch-causing, oversized impurity particles are often quantified by large particle count (LPC) measurements, and the RRE tends to introduce the largest proportion of LPCs into the copper slurry relative to other components such as the DR and CI (see FIG. 1). Therefore, the LPC characteristics of the final slurry are largely dictated by the primary contributor, the RRE. If an RRE can be selected which contributes to fewer LPCs in the final slurry, some of the deep scratches could possibly be avoided. By selecting the RRE and its amount according to the equation provided above, the LPCs in the resulting slurry can be minimized.

Traditionally, light scattering has been the method of choice for studying LPCs and thus physical impurities in copper slurry concentrates. One disadvantage of this is that light scattering does not distinguish between actual particles and air bubbles, both of which could have significantly different refractive indices than the background medium. Naturally, air bubbles will not cause deep scratching during CMP polishing and essentially provide parasitic and inaccurate readings in LPC measurements, the very purpose of which are to determine how many scratch-causing oversized impurity particles are present in the CMP slurry. As a result, light scattering is a delicate technique for measuring LPCs, as solutions must be handled gently and be given sufficient time to settle in between the times they are made and the times they are measured to allow bubbles to settle out of solution.

Consequently, the present disclosure establishes that while light scattering to detect physical impurities or LPCs can be used, conductivity measurements can detect aqueous, charged soluble impurities. A combination of these methods can also provide sufficient evidence to indicate if the purity level of the RRE if high enough and how that will correlate with LPC contributions to the slurry. Rather than detect physical impurities, which light scattering can give false positive readings for when air bubbles are present in solution, conductivity measurements will detect aqueous, soluble charged impurities that a dissolved RRE will contribute to solution.

The present disclosure also shows how the RRE in DIW based on conductivity measurements correlates with LPCs and if those correlations hold true over a large concentration range of dissolved RRE in DIW. FIGS. 2a-2d suggest that, across a concentration range up to near solubility limits for the RRE in solution, lower conductivities are correlated with reduced LPC numbers.

Figure 2A:
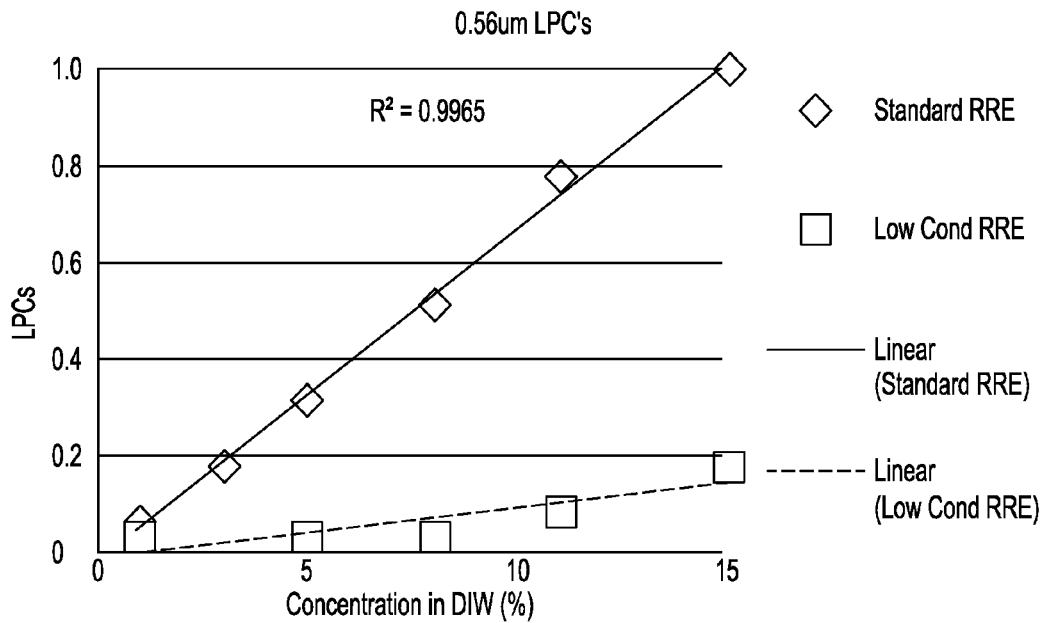
FIGS. 2a-2c are graphical representations of the (a) 0.56 μm LPCs, (b) 1.0 μm LPCs, and (c) conductivity as a function of weight % RRE in DIW solutions. Lower conductivities of RRE in DIW solutions correlate with lower LPCs across the entire concentration range studied.
Figure 2B:
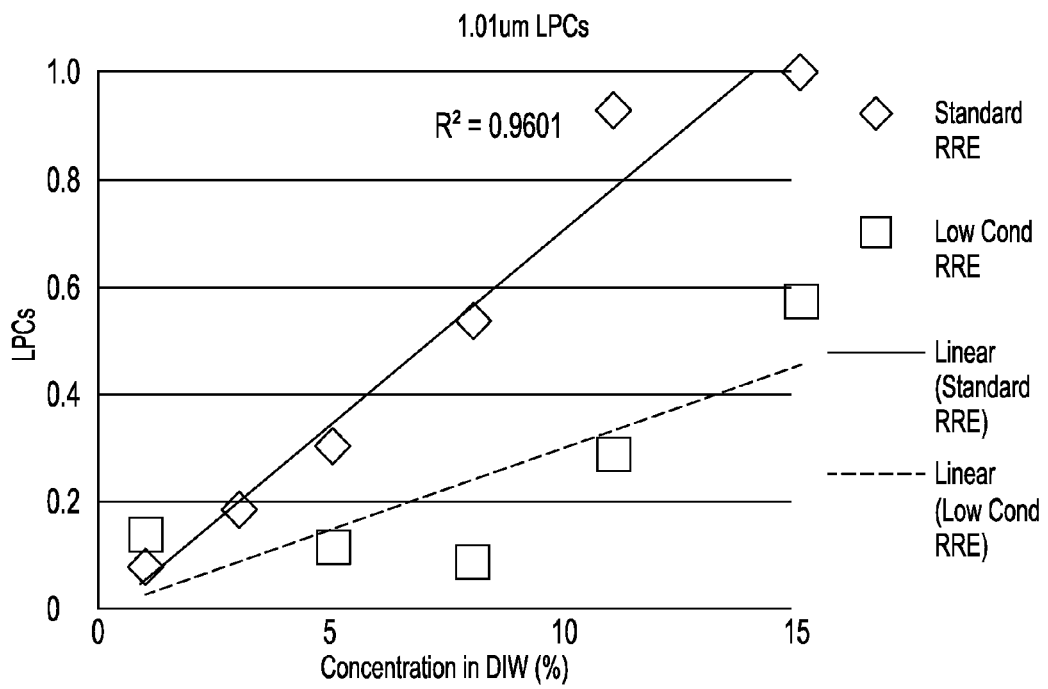
Figure 2C:
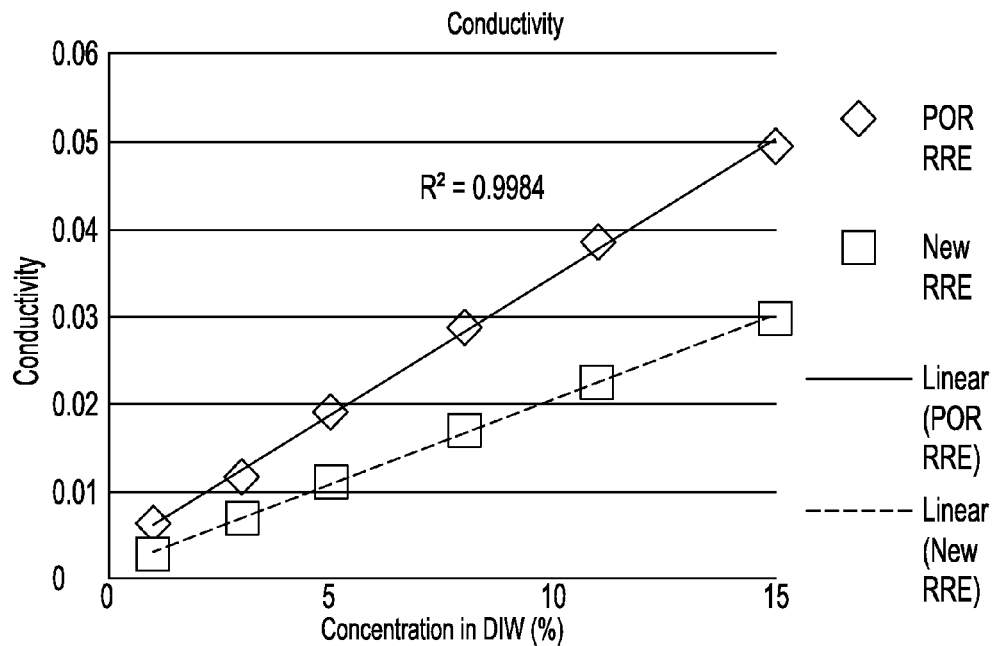
Figure 2D:
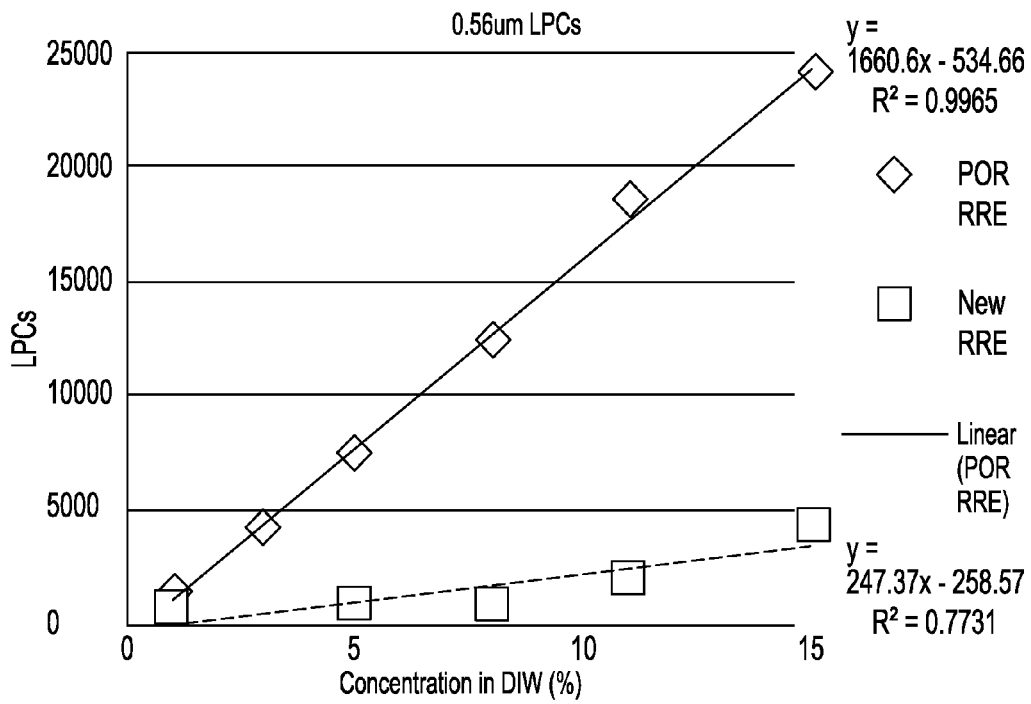
FIG. 2d shows a graphical representation of the absolute LPC for a currently available and commonly used glycine RRE, and for an RRE selected according to the principles of the present disclosure.

In FIG. 2d, data points for LPCs of a glycine RRE that is a currently used industry standard (the "POR" RRE), one with a high conductivity, are plotted against LPC data points for a glycine RRE that is selected according to the principles of the present disclosure and Equation 1 above, namely with low conductivity. As can be seen, the glycine RRE that satisfies equation 1 has a significantly lower LPC at all concentrations than the standard glycine RRE that does not satisfy Equation 1. The data shown is for particles larger than 56 μm, as measured by a Celerity tool, and the wt % on the x-axis is the amount of the glycine RRE in deionized water (DIW).

The POR RRE has an extremely well-fit linear regression trendline with an R^2 value of 0.9965. Thus, for the POR RRE, the LPC count could be expressed as a formula (Equation 2):

$$L \leq a*W + b,$$

wherein L represents the large particle counts per milliliter of removal rate enhancer in a solution of deionized water, W is the wt % of the removal rate enhancer in the solution, and a and b are the slope and intercept of the regression line, respectively.

In the plot of FIG. 2d, the slope a of the regression line for the POR RRE is 1660.6, and the intercept b is 534.66. Accordingly, the present disclosure contemplates that the RRE can be selected so that it satisfies Equation 2, wherein $0 \leq a \leq 1600$, and wherein $0 \leq b \leq 50$, wherein "a" has units of particles/mL/g and "b" has units of particles/mL.

Theoretically, b should always be equal to zero, because at zero wt % RRE, one would expect zero LPCs in a solution of solely DIW. However, the regression trendlines didn't precisely pass through the origin of the plot. Also, even DIW alone may have some residual LPCs.

The data points of the "new" RRE, i.e. one selected according to Equation 1 above, show one example of an RRE that also satisfies Equation 2. The regression line for this RRE has a slope a of 247.37 and an intercept b of −258.57. As stated above, the value of a can be such that $0 \leq a \leq 1600$, any values within that range, or any subranges therebetween. Similarly, b can be selected so that $0 \leq b \leq 50$, any values within that range, or any subranges therebetween.

Figure 3:
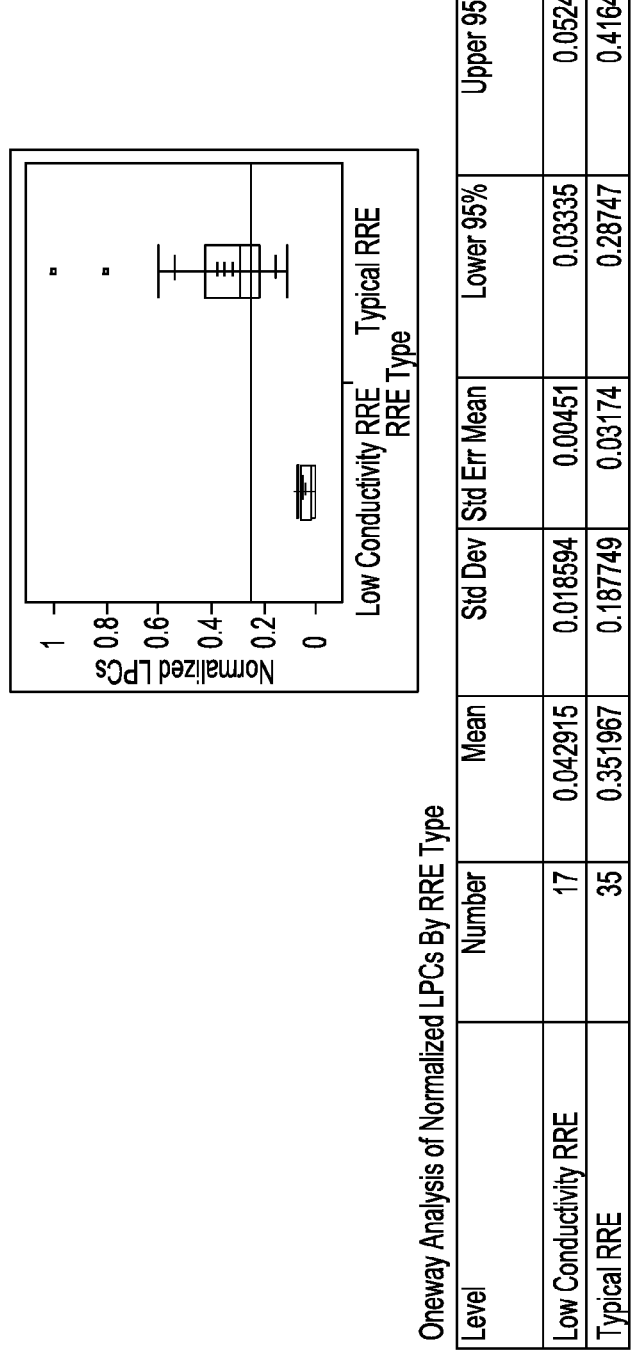
FIG. 3 shows a boxplot comparison of LPCs in high volume manufactured copper CMP slurries utilizing a prior art RRE source with relatively higher conductivities and thus higher LPC contributions to the CMP slurries compared to an RRE source which passes the purity requirements according to the equation of the present disclosure below, which reduces LPCs in the final slurries.

The data in FIG. 2d is useful because the amount of LPCs in a RRE/DIW solution correlates strongly with the amount of LPCs when the CMP slurry is prepared with additional ingredients. This is because, as discussed above and shown in FIG. 1, the RRE is the biggest contributor of LPCs to the CMP slurry. FIG. 3 shows a plot of the LPCs of copper slurries manufactured at high volume utilizing both a standard RRE that doesn't satisfy the conductivity requirements established in the present disclosure, as compared to slurries utilizing low-conductivity RRE as determined by Equation 1. The LPC data clearly indicate that the purity level of the RRE, as determined by conductivity measurements described herein, correlate strongly with LPCs in the final slurry concentrate. Higher purity RRE results in slurries with fewer LPCs.

The following list defines some of the terms used in the present disclosure.

Chemical Mechanical Polishing (or Planarization (CMP): a method for planarizing semiconductor wafer surfaces by way of a synergy between chemical alteration of the surface material combined mechanical removal of the surface by way of abrasive particles Large Particle Counts (LPCs): the number of particles per mL in solution that fall above a particular diameter threshold (e.g. 0.56 um or 1.0 um)

Removal Rate Enhancer (RRE): an additive to copper CMP slurries which enhances removal rates of copper films during polishing Oxidizers for copper: chemicals that oxidize the copper atoms to a higher valence state Corrosion inhibitor: chemicals that protect the copper surface from corroding Abrasive: solid particles that aid in mechanical removal of wafer surface The present disclosure having been thus described with particular reference to the preferred forms thereof, it will be obvious that various changes and modifications may be made therein without departing from the spirit and scope of the present invention as defined in the appended claims.

What is claimed is:

1. A copper chemical mechanical polishing composition, comprising:

glycine, present in an amount up to 20 wt %, based on the weight of the composition;
an azole corrosion inhibitor
an abrasive;
wherein said glycine has a conductivity C in deionized water, and wherein glycine obeys the following inequality:

$$C \leq a*W+b,$$

wherein W is the wt % of the glycine, based on the total weight of the composition, wherein 0.0005<a<0.0025, and wherein 0.0005<b<0.0025,
wherein said composition has a large particle count, wherein said large particle count is defined by the number of particles per milliliter of the composition having a size greater than 0.56 micrometers,
and wherein said conductivity C and said large particle count have a positive correlation, such that the lower said conductivity, the lower said large particle count.

2. The composition of claim 1, wherein the conductivity C is less than 0.0525 milliSiemens per centimeter.

3. The composition of claim 1, wherein the corrosion inhibitor is selected from the group consisting of benzotriazole, derivatives of benzotriazole, tolyl triazole, derivatives of tolyl triazole, and any combinations thereof.

4. The composition of claim 1, wherein said abrasive is selected from the group consisting of alumina, fumed silica, colloidal silica, coated particles, titania, ceria, zirconia, and any mixtures thereof.

5. The composition of claim 1, further comprising an oxidizer selected from the group consisting of hydrogen peroxide, ammonium persulfate, silver nitrate, ferric nitrates, ferric chloride, per acid, per salts, ozone water, potassium ferricyanide, potassium dichromate, potassium iodate, potassium bromate, vanadium trioxide, hypochlorous acid, sodium hypochlorite, potassium hypochlorite, calcium hypochlorite, magnesium hypochlorite, ferric nitrate, $KMnO_4$, other inorganic or organic peroxides, and any mixtures thereof.

6. The composition of claim 1, further comprising an additional ingredient selected from the group consisting of surfactant, biocide, surface finisher, pH adjuster, defect reduction agent, or any mixtures thereof.

* * * * *